United States Patent
Bai et al.

(10) Patent No.: US 8,576,941 B2
(45) Date of Patent: Nov. 5, 2013

(54) CONFIGURABLE BASIS-FUNCTION GENERATION FOR NONLINEAR MODELING

(75) Inventors: Chunlong Bai, Kanata (CA); Bradley John Morris, Ottawa (CA); Brian Lehman, Ottawa (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 329 days.

(21) Appl. No.: 13/119,165

(22) PCT Filed: Nov. 16, 2010

(86) PCT No.: PCT/IB2010/055192
§ 371 (c)(1), (2), (4) Date: Mar. 15, 2011

(87) PCT Pub. No.: WO2012/066381
PCT Pub. Date: May 24, 2012

(65) Prior Publication Data
US 2012/0119811 A1    May 17, 2012

(51) Int. Cl.
*H04K 1/02* (2006.01)
(52) U.S. Cl.
USPC ........ 375/296; 375/295; 375/297; 455/114.3; 455/114.2; 455/126
(58) Field of Classification Search
USPC ............ 375/296, 295, 297; 455/114.3, 114.2, 455/126
See application file for complete search history.

(56) References Cited

U.S. PATENT DOCUMENTS

| | | | |
|---|---|---|---|
| 6,236,837 B1 | 5/2001 | Midya | |
| 6,240,278 B1 | 5/2001 | Midya et al. | |
| 6,798,843 B1 | 9/2004 | Wright et al. | |
| 7,149,257 B2 | 12/2006 | Braithwaite | |
| 7,295,815 B1 | 11/2007 | Wright et al. | |
| 8,121,560 B1 * | 2/2012 | Anaraki et al. | 455/114.3 |
| 2005/0163250 A1 | 7/2005 | McCallister | |
| 2005/0163251 A1 * | 7/2005 | McCallister | 375/296 |
| 2005/0163268 A1 | 7/2005 | McCallister et al. | |
| 2008/0008263 A1 | 1/2008 | Keerthi et al. | |
| 2008/0144709 A1 | 6/2008 | McCallister et al. | |
| 2009/0124218 A1 | 5/2009 | McCallister et al. | |
| 2009/0302940 A1 * | 12/2009 | Fuller et al. | 330/149 |

OTHER PUBLICATIONS

Oh, D. G. et al. "Adaptive Nonlinear Equalizer with Reduced Computational Complexity." Signal Processing Elsevier Science Publishers B.V., Amsterdam, NL, vol. 47, No. 3, Dec. 1, 1995.

(Continued)

*Primary Examiner* — Zewdu Kassa
(74) *Attorney, Agent, or Firm* — Coats and Bennett, P.L.L.C.

(57) ABSTRACT

Digital predistorter circuits with selectable basis function configurations are described. In some embodiments, an input scaling block is introduced prior to a basis function generator structure. The input scaling factor is based on the input signal's average power. In other embodiments, configurable connection coefficients are used to construct the orthogonal basis functions. Multiple sets of tap weights for the predistorter are maintained, each set corresponding to a given basis function configuration. In an example method for pre-distorting an input signal to compensate for distortion introduced by an electronic device, a statistic characterizing the input signal is calculated, and one of a pre-determined set of basis function configurations is selected, based on the statistic. A set of pre-distortion model weights corresponding to the selected basis function configuration are determined, after which the selected basis function configuration and the corresponding set of pre-distortion model weights are applied to the input signal.

23 Claims, 14 Drawing Sheets

(56) References Cited

OTHER PUBLICATIONS

Li, H. et al. "Nonlinear Least Squares Lattice Algorithm for Identifying the Power Amplifier with Memory Effects." Proceedings of the 2006 Vehicular Technology Conference, May 10, 2006.

Ren, K. et al. "Identification of Memory Polynomial Nonlinear Models for RF Power Amplifiers with a Systolic Array Based QRD-RLS Algorithm." 2008 Asia-Pacific Microwave Conference, Dec. 16, 2008.

Baudoin, G. et al. "Adaptive Polynomial Pre-Distortion for Linearization of Power Amplifiers in Wireless Communications and WLAN." International Conference on Trends in Communications (EUROCON'2001), Bratislava, Slovakia, Jun. 4-7, 2001.

Raich, R. et al. "Orthogonal Polynomials for Power Amplifier Modeling and Predistorter Design." IEEE Transactions on Vehicular Technology, vol. 53, No. 5, Sep. 2004.

* cited by examiner

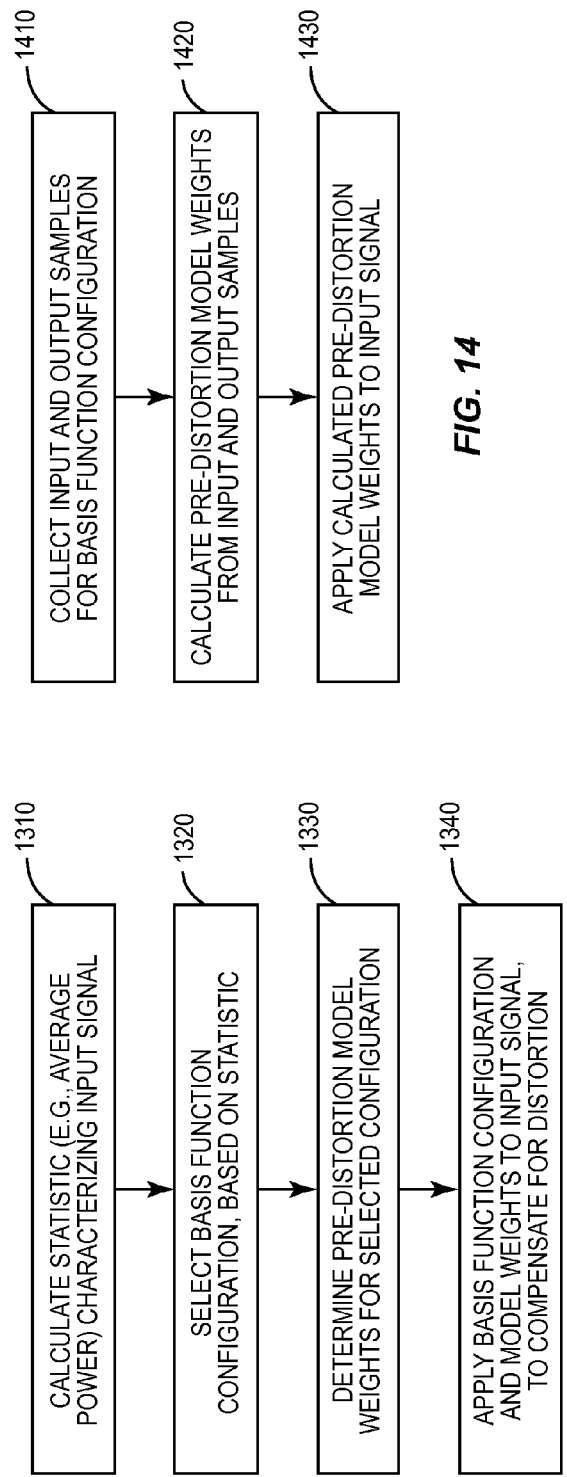
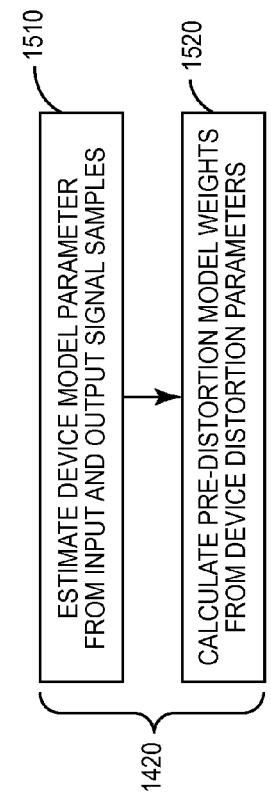
FIG. 13
FIG. 14
FIG. 15

CONFIGURABLE BASIS-FUNCTION GENERATION FOR NONLINEAR MODELING

BACKGROUND

The present invention relates generally to techniques for constructing physical models of non-linear electronic devices and, more particularly, to methods and apparatus for compensating an input signal for distortion introduced to the input signal by an electronic device.

The design of radio-frequency power amplifiers for communications Applications often involves a trade-off between linearity and efficiency. Power amplifiers are typically most efficient when operated at or near the saturation point. However, the response of the amplifier at or near the point of saturation is non-linear. Generally speaking, when operating in the high-efficiency range, a power amplifier's response exhibits a nonlinear response and memory effects.

One way to improve a power amplifier's efficiency and its overall linearity is to digitally pre-distort the input to the power amplifier to compensate for the distortion introduced by the power amplifier. In effect, the input signal is adjusted in anticipation of the distortion to be introduced by the power amplifier, so that the output signal is largely free of distortion products. Generally, the pre-distortion is applied to the signal digitally, at baseband frequencies, i.e., before the signal is upconverted to radio frequencies.

These techniques can be quite beneficial in improving the overall performance of a transmitter system, in terms of both linearity and efficiency. Furthermore, these techniques can be relatively inexpensive, due to the digital implementation of the predistorter. In fact, with the availability of these techniques, power amplifiers may be designed in view of more relaxed linearity requirements than would otherwise be permissible, thus potentially reducing the costs of the overall system.

SUMMARY

The ability of a conventional digital predistorter design to accurately model a desired distortion function depends on both the characteristics of the modeled device and the characteristics of the input signal. Thus, while a predistorter can be designed to provide excellent simulated performance for a given input signal distribution, its performance for other signal distributions may not be so good.

In particular, testing of conventional digital predistorter designs reveals that these designs are prone to stability problems when the characteristics of the real-world signals applied to these predistorters vary from the signal characteristics assumed during the design. This problem can be addressed by providing a predistorter having a set of predetermined, selectable, basis function configurations. In some embodiments, the configurability of this predistorter is achieved by introducing an input signal scaling block preceding a conventional orthogonal basis function generator structure, where the input signal scaling factor is calculated based on a statistic of the input signal, such as its average power. In other embodiments, the configurability is achieved by introducing configurable connection coefficients used to construct the orthogonal basis functions, so that the orthogonal basis functions themselves are configurable. In these embodiments, the connection coefficients are determined based on a statistic characterizing the input signal, such as its average power level. In either case, the system maintains multiple sets of tap coefficients for the predistorter, each set corresponding to one of a plurality of configurable basis function configurations used by the system.

Accordingly, embodiments of the present invention include various methods for compensating an input signal for distortion introduced by an electronic device operating on the input signal to produce an output signal. In an example method, a statistic characterizing the input signal over a selected time interval is calculated, and one of a predetermined plurality of basis function configurations for a non-linear model of pre-distortion for compensating the distortion is selected, based on the statistic. This statistic may be the average power level of the input signal, in some embodiments. The example method further includes determining a set of pre-distortion model weights corresponding to the selected basis function configuration, after which the selected basis function configuration and the set of pre-distortion model weights are applied to the input signal, to produce a pre-distorted input signal for input to the electronic device.

In some embodiments, each of the selectable basis function configurations comprises an input scaling factor that differs for each basis function configuration and a basis function set that is the same for all of basis function configurations. In these embodiments, a given basis function configuration is selected by simply selecting its input scaling factor, based on the statistic.

In other embodiments, each of the selectable basis function configurations comprises a basis function set that differs for each of the plurality of basis function configurations. In these embodiments, a basis function configuration is selected by selecting one of the basis function sets, based on the statistic. Each basis function set comprises one or more polynomials comprising a sum of power functions weighted by connection coefficients, in some of these embodiments, in which case a given basis function configuration is selected by selecting the corresponding set of connection coefficients, based on the statistic.

In any of the methods, summarized above, the set of pre-distortion model weights may be determined by retrieving, from memory, previously calculated pre-distortion model weights corresponding to the selected basis function configuration. In some of these embodiments, pre-distortion model weights corresponding to at least one of the pre-determined basis function configurations may be dynamically adapted, such that the previously calculated pre-distortion model weights retrieved from memory comprise previously adapted pre-distortion model weights corresponding to the selected basis function configuration.

Dynamic adaptation of the pre-distortion model weights corresponding to a given basis function configuration may comprise, in some embodiments, collecting first signal samples, corresponding to the input signal, over two or more time intervals during which the given basis function configuration is applied to the input signal, and collecting second signal samples, corresponding to the output signal, such that the second signal samples correspond in time to the first signal samples. Adapted pre-distortion model weights are then calculated from the first signal samples and the second signal samples.

Pre-distortion model weights may be determined using either an indirect-learning approach or a direct-learning approach. In the former approach, the pre-distortion model weights are estimated directly from the first signal samples and the second signal samples. With the direct-learning approach, in contrast, device distortion parameters for a device distortion model are first estimated from the first and second signal samples, where the device distortion model is based on the selected basis function configuration and reflects distortion introduced by the non-linear electronic device. The pre-distortion model weights are then calculated from the device distortion parameters.

Circuits and wireless transmitter apparatuses corresponding to the above-summarized methods are also described. An example circuit comprises a processor circuit and a pre-distortion application circuit. The processor circuit is configured to calculate a statistic characterizing the input signal over a selected time interval, from samples of the input signal, and to select, based on the statistic, one of a predetermined plurality of basis function configurations for a non-linear model of pre-distortion for compensating the distortion introduced by an electronic device. The processor circuit is further configured to determine a set of pre-distortion model weights corresponding to the selected basis function configuration. The pre-distortion application circuit is configured to apply the selected basis function configuration and the set of pre-distortion model weights to the input signal, to produce a pre-distorted input signal for input to the electronic device.

Of course, the present invention is not limited to the features, advantages, and contexts summarized above, and those familiar with pre-distortion circuits and techniques will recognize additional features and advantages upon reading the following detailed description and upon viewing the accompanying drawings.

BRIEF DESCRIPTION OF THE DRAWINGS

FIG. 13 is a process flow diagram illustrating an example method for compensating an input signal for distortion introduced by an electronic device.

FIG. 14 is another process flow diagram, illustrating the derivation and application of pre-distortion model weights.

FIG. 15 is another process flow diagram, illustrating an example technique for calculating pre-distortion model weights.

DETAILED DESCRIPTION

Figure 1:
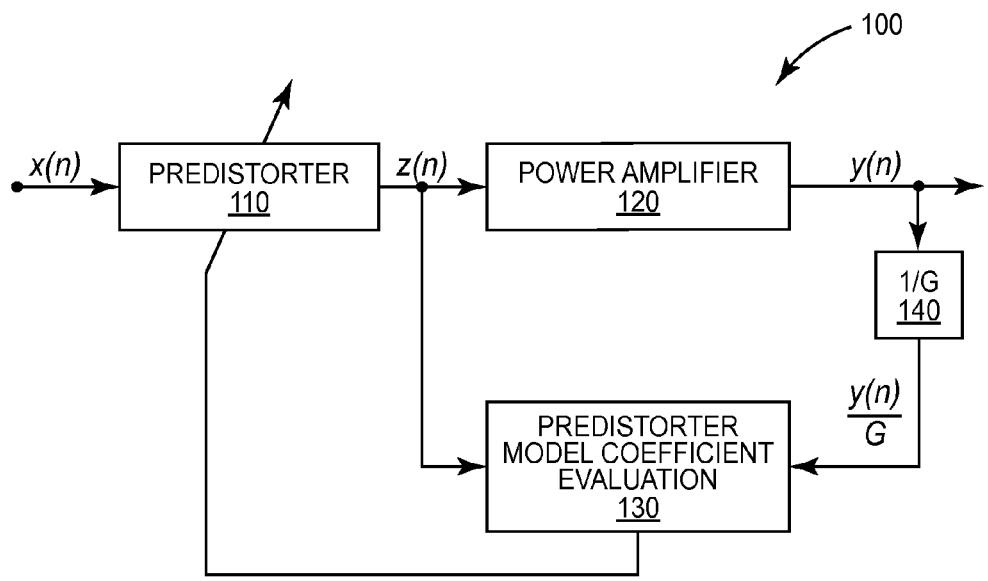
FIG. 1 illustrates an indirect-learning architecture for a pre-distortion circuit.

Referring now to the drawings, FIG. 1 illustrates a pre-distortion system 100, configured to compensation for distortion introduced to a communications signal by power amplifier 120. As noted above, a power amplifier is typically most efficient when it is operated in a non-linear range. However, the non-linear response of a power amplifier 120 causes unwanted out-of-band emissions and reduces the spectral efficiency in a communication system. A predistorter 110 may be used to improve the power amplifier's efficiency and linearity by "pre-distorting" the power amplifier's input signal to compensate for the non-linear distortion introduced by the power amplifier 120. The cascading of predistorter 110 and power amplifier 120 improves the linearity of the output signal, even while power amplifier 120 is operated at high efficiency. Although pre-distortion is used in the circuits and systems described herein to linearize the output of a power amplifier 120, those skilled in the art will appreciate that the techniques described herein are more generally applicable to characterizing and/or compensating for distortion caused by any type of non-linear electronic device.

As seen in the pre-distortion system 100 pictured in FIG. 1, an input signal x(n) is input to a predistorter 110. Predistorter 110 pre-distorts the input signal x(n) to compensate for the distortion introduced by power amplifier 120 when the power amplifier 120 is operated in its non-linear range. The pre-distorted input signal z(n) generated by predistorter 110 is then applied to the input of power amplifier 120, which amplifies the pre-distorted input signal z(n) to produce an output signal y(n). If predistorter 110 is properly designed and configured, then the output signal y(n) contains fewer distortion products and out-of-band emissions than if power amplifier 120 were used alone.

To compensate for the distortion introduced by power amplifier 120, predistorter 110 must have a non-linear transfer function that effectively reverses the non-linear effects of the power amplifier 120. To properly configure the predistorter 110, an appropriate model for this non-linear transfer function is needed. Two different approaches to deriving this non-linear transfer function are possible. The first approach utilizes an indirect-learning architecture, as pictured in FIG. 1, and the second uses the direct-learning architecture of FIG. 2.

In both cases, the signal z(n) input to power amplifier 120 and a scaled version of the amplifier output signal y(n) are applied to a distortion modeling circuit. In the indirect-learning architecture of FIG. 1, this distortion modeling circuit comprises a predistorter model coefficient evaluation block 130. In the direct-learning architecture of FIG. 2, the distortion modeling circuit has two functional blocks: a power amplifier model coefficient evaluation block 210 and a predistorter model coefficient derivation block 220. The detailed operation of these distortion modeling circuits is described below.

Figure 2:
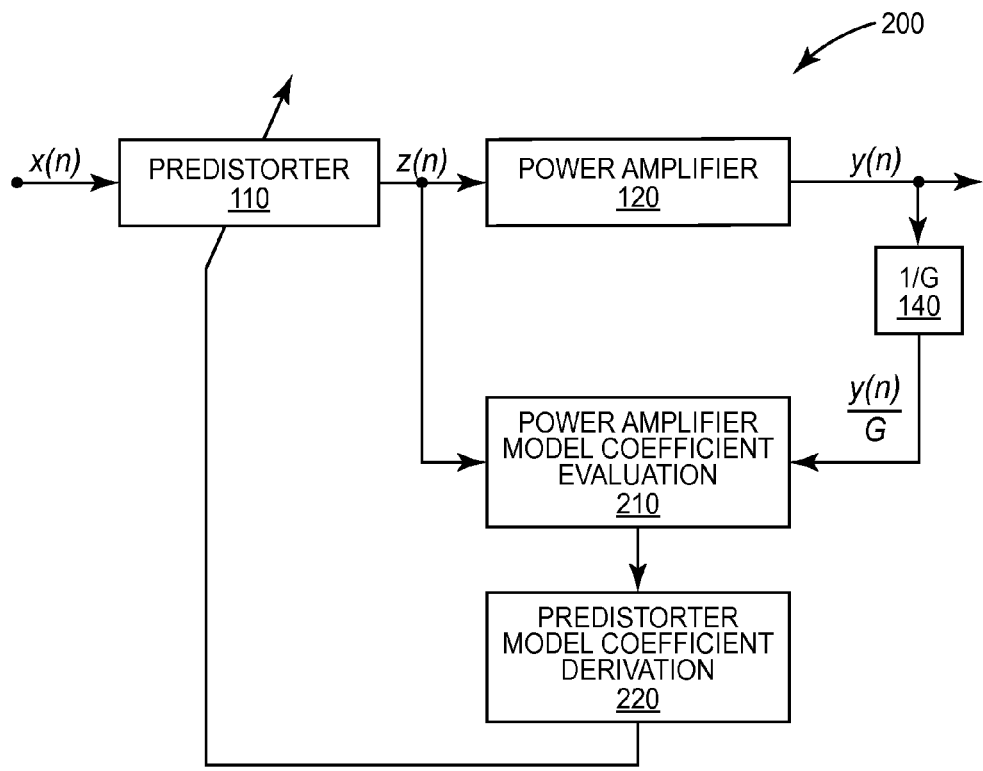
FIG. 2 illustrates a direct-learning architecture for a pre-distortion circuit.

In any case, the scaling of the power amplifier signal, illustrated as attenuator 140 in FIGS. 1 and 2, reflects the net linear gain G that is desired from the combination of predistorter 110 and power amplifier 120. Scaling the output signal y(n) by the inverse of G permits the non-linearities introduced by power amplifier 120 to be analyzed independently from its gain.

In the indirect-learning architecture of FIG. 1, a general structure for a model of predistorter 110 is taken as given, and the predistorter model's coefficients (parameters) are estimated directly from the input and outputs of power amplifier 120. Thus, predistorter modeling circuit 130 evaluates the amplifier input signal z(n) and the scaled amplifier output signal y(n)/G according to a predetermined non-linear model for the predistorter to directly determine a set of weighting coefficients to be applied by the predistorter 110. (The details of this process are described below.) With this indirect approach, a model for the power amplifier 120 is not derived. Rather, the non-linear characteristics of power amplifier 120 are learned indirectly, through the modeling of the pre-distortion necessary to counteract the distortion introduced by power amplifier 120.

In contrast, the direct-learning architecture of FIG. 2 directly characterizes the non-linear performance of power amplifier 120. First, power amplifier modeling circuit 210 evaluates the amplifier input signal z(n) and the amplifier output signal y(n)/G according to a predetermined non-linear model for the power amplifier 120. The weighting coefficients that best fit the power amplifier's non-linear characteristics to the power amplifier model in block 120 are then used by coefficient derivation circuit 220 to generate weights for configuring the predistorter 110.

In the direct-learning architecture, the distortion introduced by the power amplifier 120 is typically represented by a complicated non-linear function, which will be referred to herein as the distortion function. In the indirect-learning architecture, the response of the predistorter 100 is represented by a similar non-linear distortion function. In either case, one approach to modeling the distortion function, referred to herein as the decomposition approach, is to decompose the distortion function into a set of less complicated basis functions, each of which separately acts on the input signal. The output of the distortion function is then modeled as the weighted sum of the basis function outputs. The set of basis functions used to model the distortion function is referred to herein as the basis function set.

Figure 3:
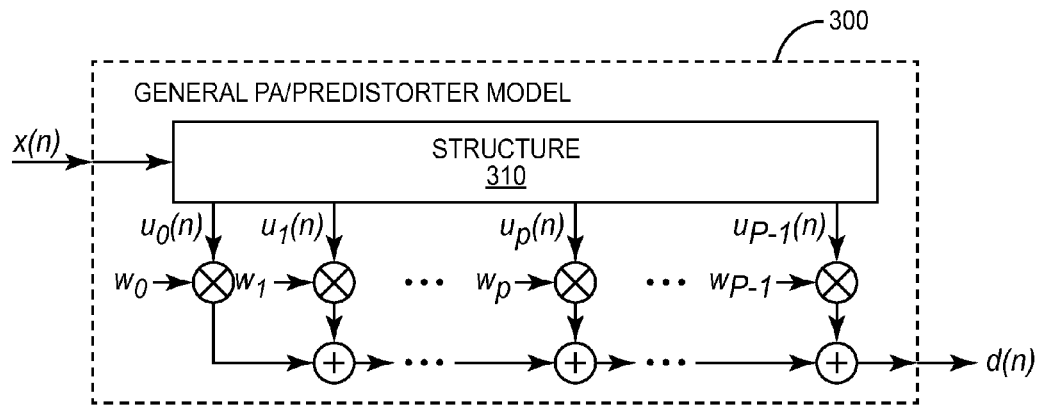
FIG. 3 illustrates a generic distortion model for modeling distortion introduced by a predistorter or power amplifier.

FIG. 3 illustrates a generalized multi-branch distortion model 300, which may represent the distortion introduced by the power amplifier 120 (e.g., as modeled by model coefficient evaluation unit 210 in the direct learning architecture of FIG. 2) or the pre-distortion transfer function of predistorter 110 (e.g., as modeled by the predistorter model coefficient evaluation unit 130 of FIG. 1). In either case, the distortion model 300 comprises a structure 310 having P output taps, labeled $u_0(n)$ to $u_{P-1}(n)$. Each of these output taps represents an operation on the input signal x(n)—these operations may correspond to a predetermined basis function set, as will be discussed in further detail below.

The model structure 310 operates on the input signal x(n) to produce data samples $\{u_0(n), u_1(n), \ldots u_{p-1}(n)\}$. Distortion model 300 then computes a weighted sum of the data samples $\{u_0(n), u_1(n), \ldots u_{p-1}(n)\}$ to obtain a distorted input signal d(n). More specifically, the data samples $\{u_0(n), u_1(n), \ldots u_{p-1}(n)\}$ are multiplied by corresponding weighting coefficients $\{w_0(n), w_1(n), \ldots w_{p-1}(n)\}$, and the resulting products are added together to obtain d(n).

The distortion model shown in FIG. 3 can be represented by:

$$d(n) = \sum_{p=0}^{P-1} w_p u_p(n). \qquad \text{Eq. 1}$$

Equation 1 can be written as a linear equation according to:

$$d(n) = u^T(n)w, \qquad \text{Eq. 2}$$

where u(n) is a P×1 vector of data samples output by the structure at time n, and where w is a P×1 vector of the weighting coefficients.

For a given vector u, d(n) is the desired output of the model (e.g., the actual output of power amplifier 120, in the direct-learning architecture, or the desired output of predistorter 110, in the indirect-learning architecture). The weighting coefficients w that best fit the vector u to the desired output d(n) over a period of time can be learned by fitting multiple observations of u to the corresponding desired outputs d(n). Thus, for a set of observations taken at N sampling instances, the corresponding linear equations given by Equation 2 can be expressed as:

$$U \cdot w = d, \qquad \text{Eq. 3}$$

where U is an N×P matrix of data signals and d is the desired output signal vector of the distortion model. The columns of the matrix U correspond to the data samples output by structure 130, while each row of the matrix corresponds to a different sampling instance. Equation 3 can be evaluated according to well known techniques (e.g., to minimize a criterion such as a least-square-error criterion) to find the weights w that best model the distortion of the amplifier 120 or the predistorter 110.

Figure 4:
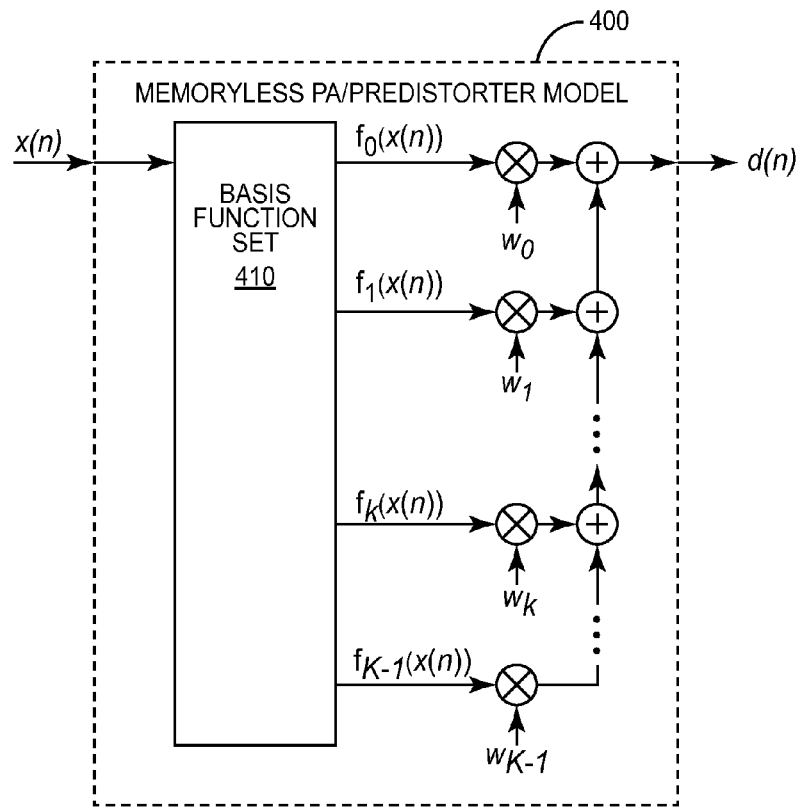
FIG. 4 illustrates a memoryless distortion model for modeling distortion introduced by a predistorter or power amplifier.

FIG. 4 illustrates a memoryless, multi-branch distortion model 400 for modeling a distortion function. In distortion model 400, the basic structure of the model is determined by a basis function set 410, comprising multiple basis functions. Each of the K branches in the model corresponds to one of these basis functions, which each operate on the input signal x(n) and which are represented in FIG. 4 as $f_0(x(n))$ to $f_{K-1}(x(n))$. In this memoryless model, these functions each operate only on a present sample x(n) of the input signal, and thus are "memoryless" functions. Like the functions u(n) in the more general model illustrated in FIG. 3, each of the basis function output signals $\{f_0(x(n)), f_1((x(n)), \ldots f_{K-1}(x(n))\}$ are multiplied by corresponding weighting coefficients $\{w_0(n), w_1(n), \ldots w_{K-1}(n)\}$ and added together to obtain d(n).

A key difference between the models of FIG. 3 and FIG. 4 is that the functions $f_0(x(n))$ to $f_{K-1}(x(n))$ in FIG. 4 are constrained to be memoryless. Thus, the model of FIG. 4 can be viewed as a special case of the model of FIG. 3, where each of the functions $f_0(x(n))$ to $f_{K-1}(x(n))$ corresponds to one of the functions $\{u_0(n), u_1(n), \ldots u_{p-1}(n)\}$ in FIG. 3. Accordingly, the weights w that best model the distortion of the amplifier 120 or the predistorter 110 can be found in a similar manner to that described above, e.g., by fitting a matrix of N observations of the outputs of basis function set 410 to a desired output signal vector d. Of course, because model 400 does not account for memory effects, the accuracy of this model relative to the actual distortion function of a given power amplifier may be limited.

Figure 5:
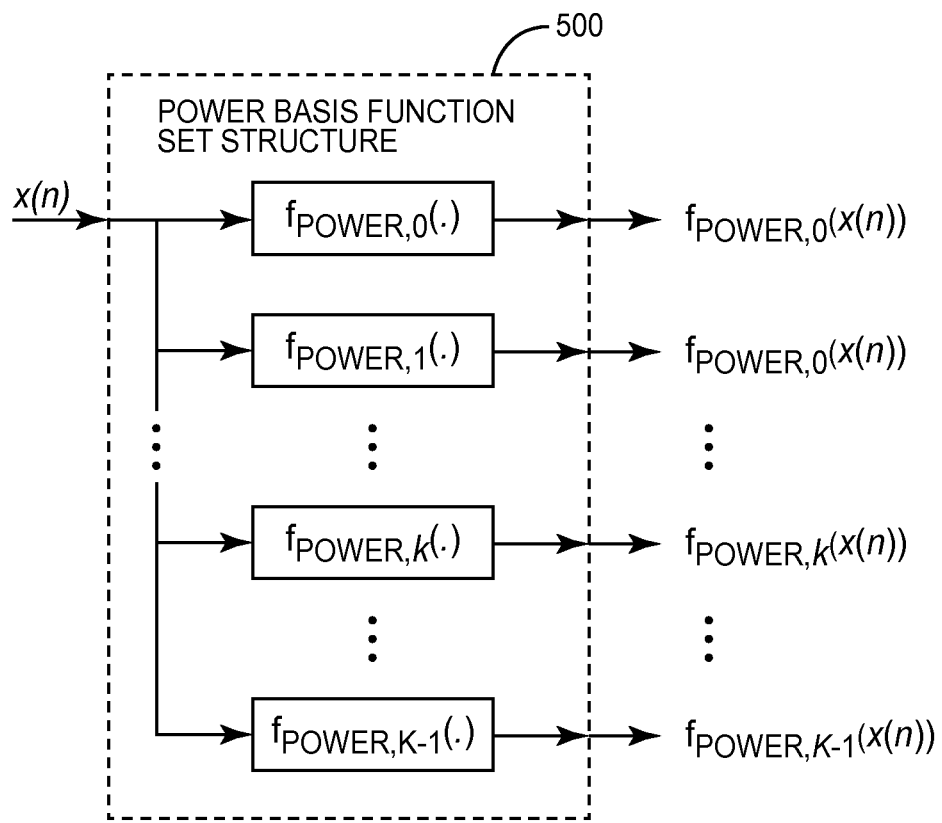
FIG. 5 illustrates a basis function set structure based on the use of power functions.

In some embodiments of this model, the basis function set 410 may consist of a set of power functions. This is illustrated in FIG. 5, where basis function set 500 comprises K outputs designated $f_{POWER,0}(x(n))$ to $f_{POWER,K-1}(x(n))$, where $f_{POWER,k}(x(n))=x(n)|x(n)|^k$. If the power basis function set 500 of FIG. 5 is used to model a distortion transfer function, then basis function set 500 corresponds to basis function set 410 of FIG. 4 and structure 310 of FIG. 3. Thus, the data samples $\{u_0(n), u_1(n), \ldots u_{p-1}(n)\}$ correspond to the outputs from the power basis functions $\{f_{POWER,0}(x(n)), f_{POWER,1}(x(n)), \ldots f_{POWER,K-1}(x(n))\}$ (where P=K). Thus, a matrix U, comprising N observations of the outputs of power basis function set 500, can be formed and fitted to a desired output signal vector d to determine the weighting coefficients w that most closely model the desired distortion function.

Figure 6:
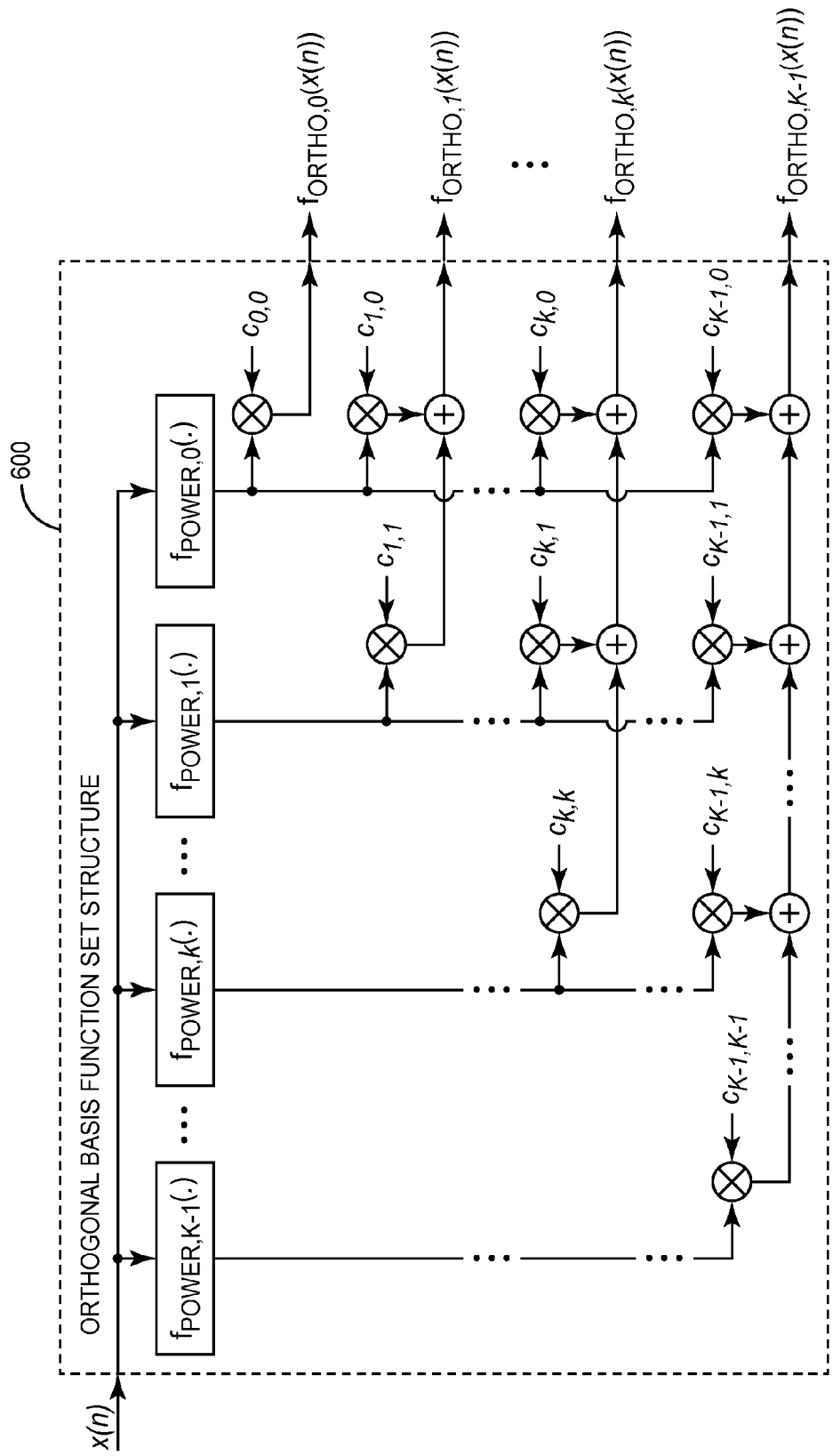
FIG. 6 illustrates an orthogonal basis function set structure for modeling distortion.

An orthogonal basis function set can be constructed as a weighted summation of the power basis functions. An orthogonal basis function set can be advantageous in many applications, as it can provide better numerical stability during the matrix mathematics used to evaluate weighting coefficients for the distortion models. FIG. 6 illustrates the basis function set structure 600 for an orthogonal basis function set, where the outputs $f_{ORTHO,0}(x(n))$ to $f_{ORTHO,K-1}(x(n))$ correspond to the output samples $\{u_0(n), u_1(n), \ldots u_{p-1}(n)\}$ of the general model 300 of FIG. 3. In this case, each data sample $u_k(n)$ can be expressed as:

$$u_k(n) = f_{ORTHO,k}(x(n)) = \sum_{h=0}^{k} c_{k,h} f_{POWER,h}(x(n)), \quad \text{Eq. 4}$$

where the subscript 'ORTHO,k' of the tap function $f_{ORTHO,k}(x(n))$ denotes 'orthogonal basis function of the k-th order. Each connection coefficient $c_{k,h}$ is the weight for the h-th order power basis function, $f_{POWER,h}(x(n))$, used in the summations of FIG. 6 to obtain the k-th order orthogonal basis function, $f_{ORTHO,k}(x(n))$. A given ensemble of coefficients $c_{k,h}$ identifies a particular orthogonal basis function set (as given by Equation 4).

An orthogonal basis function set can be designed based on various criteria. One design that works well for several common input signal distributions is derived in Raviv Raich, Hua Qian, and G. Tong Zhou, "Orthogonal polynomials for power amplifier modeling and predistorter design," IEEE Transactions on Vehicular Technology, vol. 53, no. 5, pp. 1468-1479, September 2004.

Figure 7:
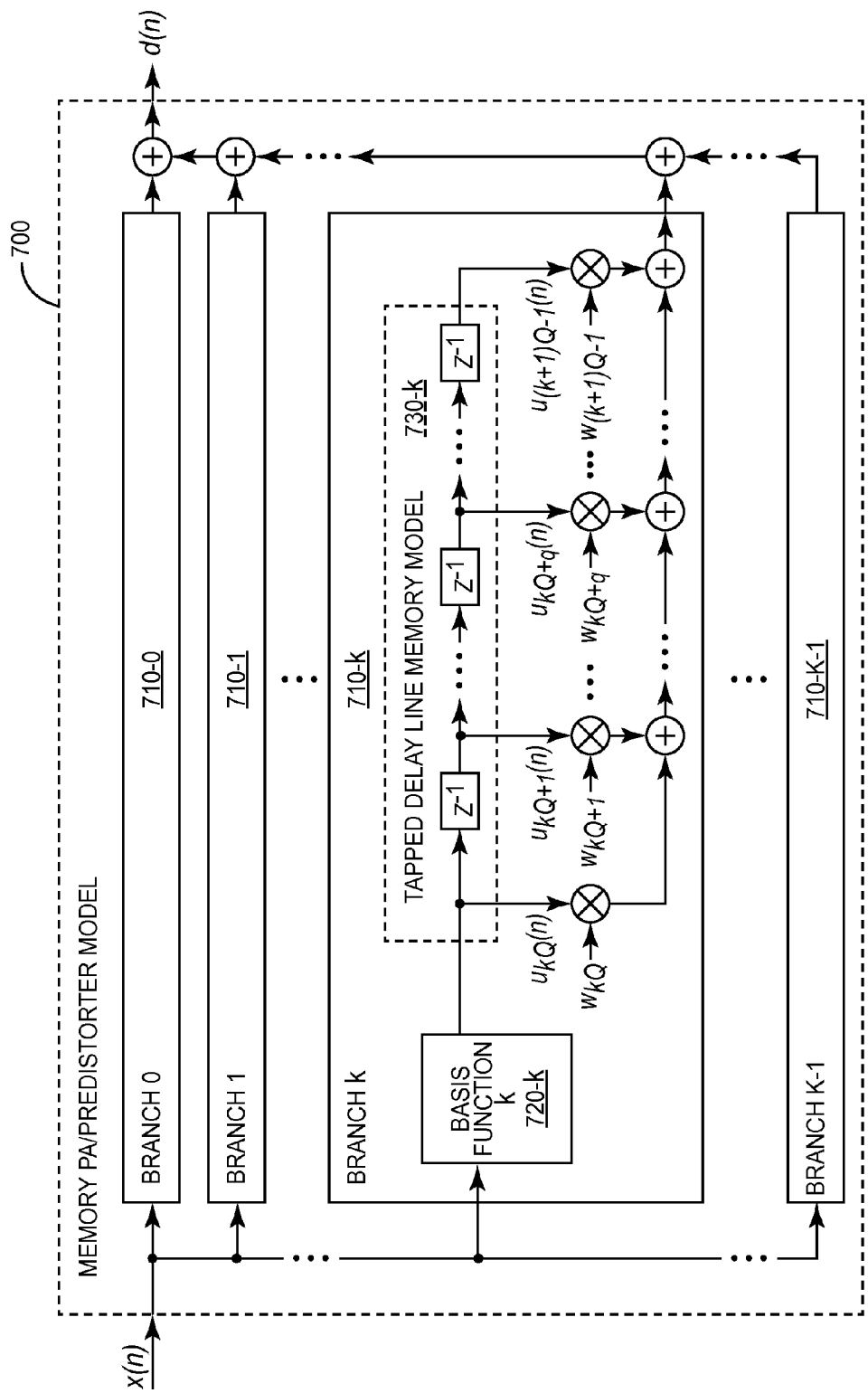
FIG. 7 illustrates a pre-distortion model including modeling of memory effects using a tapped delay line memory model.

Memory effects, i.e., the dependence of an output signal on prior states of the input signal as well as on the present state, can also be incorporated into a distortion function. FIG. 7 illustrates an example of a non-linear distortion model 700 that includes memory. In the pictured model, each of K branches 710 includes a basis function 720 followed by a corresponding memory model 730. (The basis function 720 and memory model 730 are illustrated only in branch k.) In this model, memory effects corresponding to each basis function are modeled as a tapped delay line structure. (Of course, other memory models, such as a lattice predictor memory model, are possible.) Thus the output from each branch is a weighted sum of a basis function output signal and/or delayed versions of the basis function output signal. For example, if the basis function for branch k is $f_k(\bullet)$ and the input signal is $x(n)$, then the output of branch k is a weighted sum of $f_k(x(n))$, $f_k(x(n-1))$, $f_k(x(n-2))$, etc. The k outputs from the k branches are summed to form the desired distortion signal $d(n)$.

In the model of FIG. 7, it is assumed that the memory for each branch has Q taps, corresponding to the basis function output and Q-1 delayed versions of the basis function output. Since model 700 has K branches, there are a total of KQ taps and KQ corresponding weights. The KQ data samples (some of which are shown in FIG. 7 as $u_{kQ}(n)$, $u_{kQ+1}(n)$, etc.) can be viewed as corresponding to the outputs of the model structure 300 in FIG. 3. Thus, once more, the weights w, in this case a 1×KQ vector, can be estimated by recording N observations of the outputs of the KQ samples, to form a matrix U, and then fitting the matrix U to a desired output signal vector d according to Equation 3 and a particular optimization criterion. Given an appropriate basis function set and a memory model of adequate depth, the resulting distortion model will generally better approximate real-world device distortion than a memoryless model.

As suggested in the discussion above, each of the models in FIGS. 3-7 includes a set of taps, or data samples, that can be expressed by:

$$\underset{1 \times P}{u^T(n)} \cdot \underset{P \times 1}{w} = d(n). \quad \text{Eq. 5}$$

This is true whether or not the model includes memory. In a memoryless model, the elements of $u(n)$ consist only of the basis function output signals, i.e., each element is strictly a function of $x(n)$. In a model with memory, $u(n)$ also includes elements corresponding to delayed versions of the basis function output signals. Thus, some elements of $u(n)$ may correspond to a function of $x(n-1)$, $x(n-2)$, etc. Note that in Equation 5 and as generally used herein, $(\bullet)^T$ denotes a transpose, $(\bullet)^H$ denotes a conjugate transpose, P is the number of coefficients in the model, the P×1 vector $u(n)$ denotes all of the data samples in the model at a given time index n, the P×1 vector w denotes all the coefficients in the distortion model, and $d(n)$ is the desired output of the model for time instance n.

For any given time index n, both $u(n)$ and $d(n)$ are known, and Equation 5 is a linear equation of w. As noted earlier, for observations obtained on N time indices, the corresponding linear equations expressed in Equation 5 can be compactly expressed as:

$$\underset{N \times P}{U} \cdot \underset{P \times 1}{w} = \underset{N \times 1}{d}. \quad \text{Eq. 6}$$

In Equation 6, U is the input data matrix and d is the desired output vector.

In the indirect-learning architecture of FIG. 1, $d(n)$ is the desired output of predistorter 110, which ideally has a distortion function that perfectly compensates for the distortion introduced by power amplifier 120. Thus, $d(n)$ corresponds to $z(n)$, the input to power amplifier 120, when the indirect-learning architecture is used. The input signal to the distortion model, denoted $x(n)$ in FIGS. 3-7, corresponds to the scaled output of the power amplifier 120, $y(n)/G$. Thus, for any given model structure, samples of the output from power amplifier 120 are taken for each of N sampling instances and applied to a set of basis functions to produce a matrix U. This matrix U is fitted to the desired output vector d according to Equation 6, where d is a vector of samples of the input to power amplifier, taken at the same N sampling instances used to form the matrix U.

As discussed earlier, the distortion characteristics for the power amplifier are modeled directly in the direct-learning architecture, pictured in FIG. 2. In this case, the "desired" distortion signal $d(n)$ corresponds to the scaled output of power amplifier 120, $y(n)/G$. The input $x(n)$ to the model corresponds to the input signal of the power amplifier. Thus, for any given model structure, samples of the input from power amplifier 120 are taken for each of N sampling instances and applied to a set of basis functions to produce a matrix U. This matrix U is fitted to the desired output vector d according to Equation 6, where d is a vector of samples of the scaled output from the power amplifier, taken at the same N sampling instances used to form the matrix U.

Regardless of the details of the model structure, and regardless of whether the indirect-learning architecture or the direct-learning architecture is used, at the center of the coefficient evaluation in digital predistorter of FIGS. 1 and 2 is the problem of estimating the coefficient vector w based on Equation 6 satisfying a certain criterion. In order to solve this estimation problem, inversion of the data matrix U, or $U^H U$, in some form is required. A well known measure of sensitivity of a matrix to digital operations, such as matrix inversion, is the so-called condition number, which is defined as the ratio of the maximum Eigen value of a matrix to its minimum Eigen value. Matrices with condition numbers near 1 are said to be well-conditioned.

Because matrix computations can be quite complex, an important goal in the design of a distortion model for a power amplifier or a predistorter is to provide the coefficient evaluation algorithm with a data matrix $U^H U$ that has a relatively small number of columns (to reduce the computational complexity of the matrix operations), that has a condition number as close to 1 as possible (high numerical stability), and that at the same time also models the physical behavior of the power amplifier or predistorter as exactly as possible, given a particular optimization criteria.

As noted earlier, various techniques for designing an orthogonal basis function set appropriate for modeling the distortion function of an electronic device are known. (See, for example, the article by Raich, Qian, and Zhou referenced above.) However, the ability of a given basis function set to accurately model the distortion function of a given device depends on both the characteristics of the device and the characteristics of the input signal. Thus, an orthogonal basis function set can be derived that provides excellent simulated performance for a given device and a given input signal distribution. Its performance for other devices or for other input signal distributions may not be so good.

In particular, it has been observed that when directly applying the orthogonal basis function set proposed in the Raich, Qian, and Zhou article to a set of test data, the condition number of the data matrix $U^H U$ can be very high. For example, the condition number is on the order of $10^8$ for a 5-branch memoryless model. As noted above, these high condition numbers make matrix manipulations complex and less stable, thus increasing the difficulty of implementing adaptive evaluation of the weighting coefficients for a predistorter model.

Testing indicates that these high condition numbers arise from a mismatch between the signal distribution of the real-world signals and the signal distributions of the signals used to derive the orthogonal basis function set. Although other statistical characteristics may be relevant, the average power of the input signal to the distortion model is important. In a real system, the average power of the transmitted baseband signal is not guaranteed to match the one that is used to derive the orthogonal basis function, and is potentially time varying, depending on various factors including the system load and the channel conditions. Therefore, an orthogonal basis function set developed in view of a particular expected input signal distribution is unable to provide orthogonalized basis function outputs from a direct application to real signals.

It has been observed in simulations that as the average power difference between the actual signal and the one used for deriving the orthogonal basis function set reduces, the condition number of the data matrix also reduces. Very small condition numbers are achieved when the average power difference is very small. Furthermore, it was found that by fixing the orthogonal basis function, but normalizing the input signal to the PA/predistorter model, the condition number of the data sample matrix U reduces as the normalized signal power gets closer and closer to the power of the signal used to derive the orthogonal basis function set. Conversely, the condition number of the matrix increases as the average power of the input signal diverges from that assumed during design of the orthogonal basis function set.

Figure 8A:
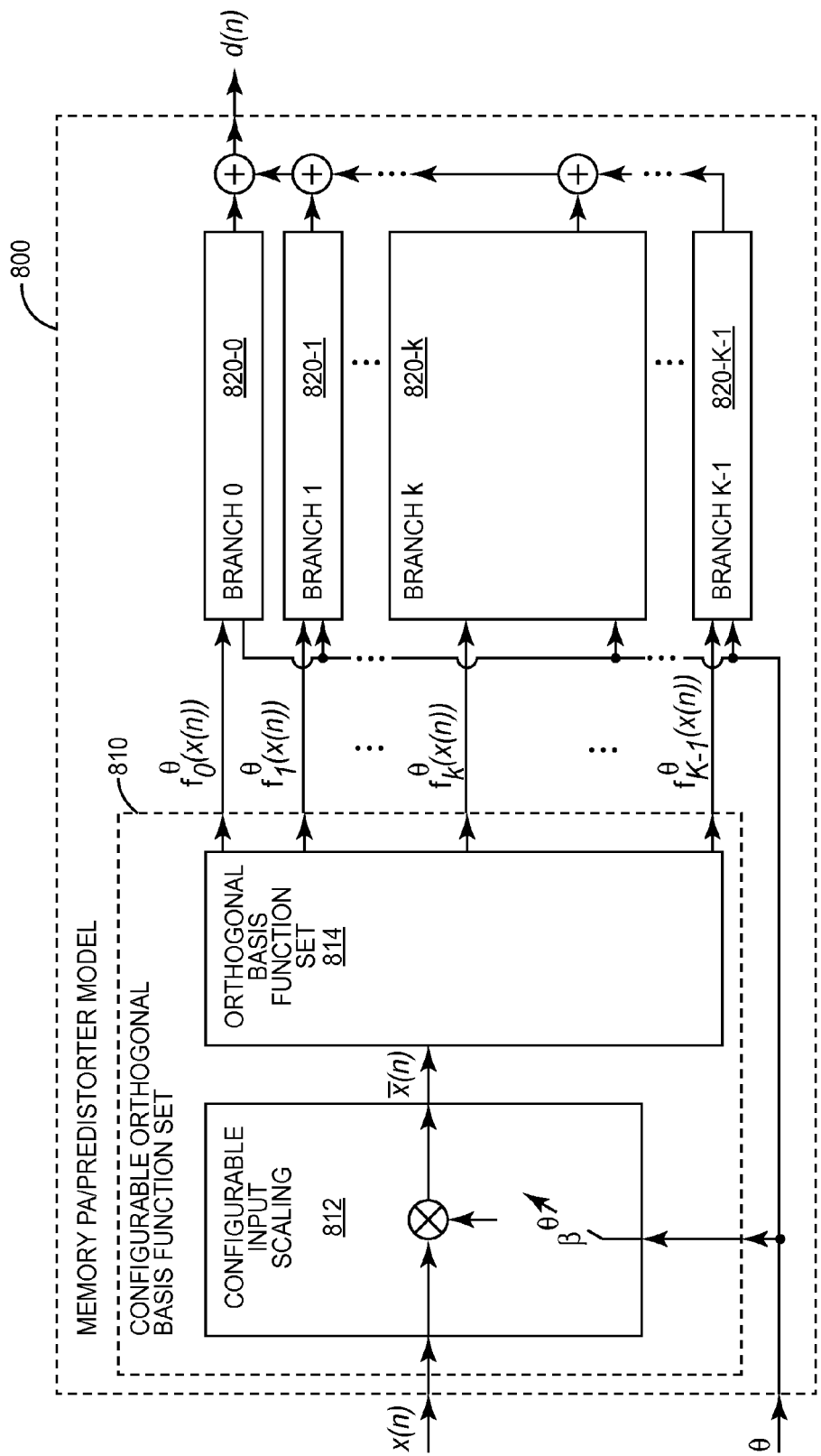
FIGS. 8A and 8B illustrate a distortion model including a configurable orthogonal basis function according to some embodiments of the present invention.

One approach to address this problem is the configurable orthogonal basis function generator structure with input scaling block as shown in FIG. 8. The distortion model 800 of FIG. 8 comprises a configurable orthogonal basis function set 810, which in turn includes an input scaling block 812 and a conventional non-configurable orthogonal basis function set 814. The configurability of the configurable orthogonal basis function set 810 is achieved by the input scaling block 812, which multiplies the input signal x(n) by a scaling factor $\beta^\theta$, to output a normalized signal $\bar{x}(n)$ that has an average signal power that better matches the signal power for which the non-configurable orthogonal basis function set 814 is designed.

The output of the configurable orthogonal basis function set 810 is a set of basis function output signals $f_0^\theta(x(n))=f_0(\bar{x}(n))$ to $f_{K-1}^\theta(x(n))=f_{K-1}(\bar{x}(n))$, where K is the number of basis functions in the set. Thus, the non-configurable orthogonal basis function set $f_0(\cdot)$ to $f_{K-1}(f)$ is operating on the normalized input signal $\bar{x}(n)$ to produce the configurable orthogonal basis function output signals $f_0^\theta(x(n))$ to $f_{K-1}^\theta(x(n))$.

In a memoryless model, combining weights w for summing together these K basis function output signals to form d(n) can be calculated using the techniques discussed above, e.g., in connection with FIG. 4. More generally, however, each branch 820 of distortion model 800 may include a memory model, such as the tapped delay line memory model 830-k illustrated in FIG. 8B. With this approach to the distortion model, each configurable basis function output signal $f_0^\theta(x(n))$ to $f_{K-1}^\theta(x(n))$ feeds a corresponding branch 820; each of those branches 820 includes a tapped delay line memory model 830. (Other memory model structures, such as a predictive lattice memory model, are possible.) Within the tapped delay line memory model 830, the basis function output signal and one or more delayed basis function output signals are combined, using configurable weighting coefficients.

Figure 8B:
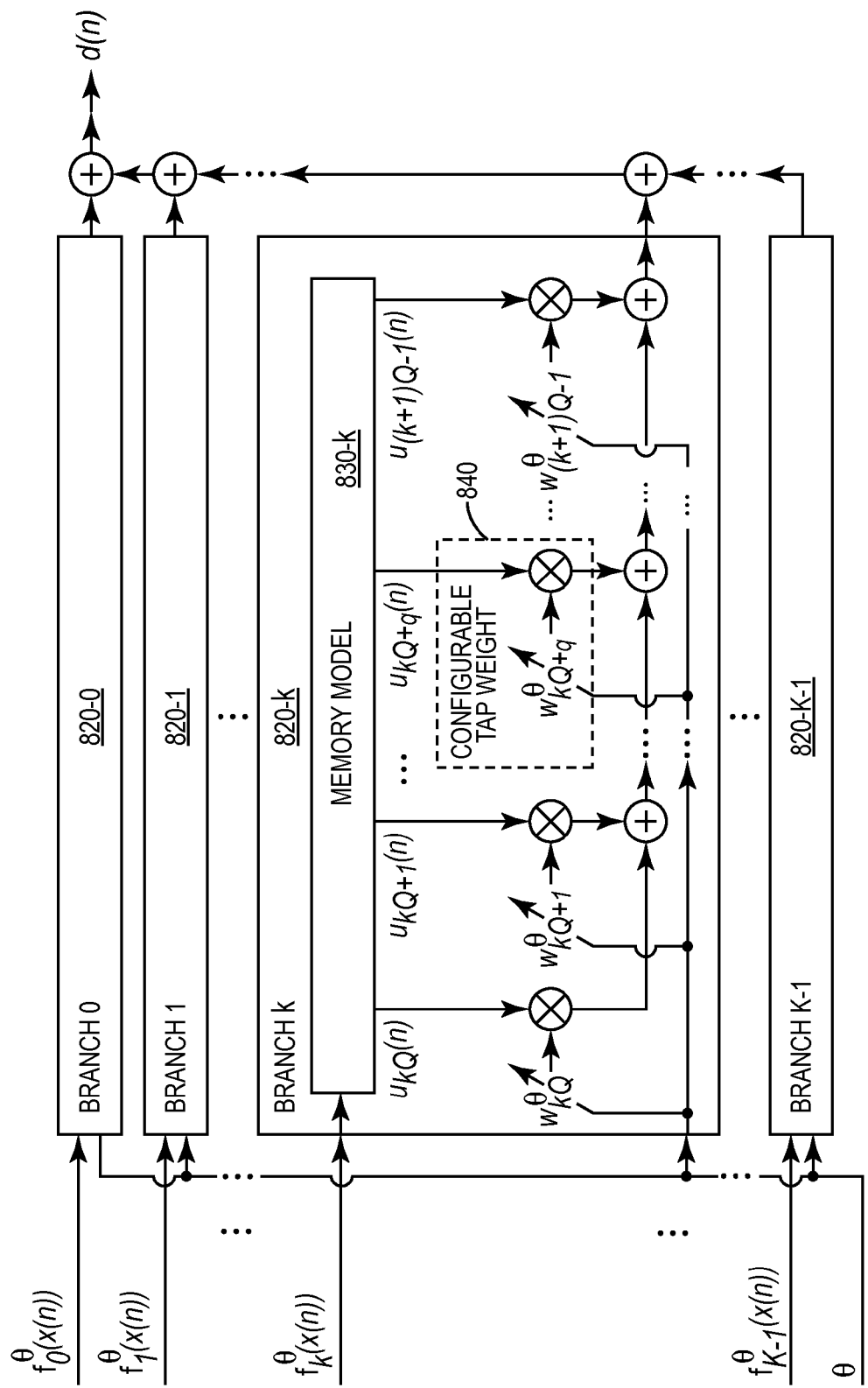

Referring to FIG. 8B, details of memory model 830-k, in branch 820-k, are illustrated. The basis function output signal $f_k^\theta(x(n))$ is fed into branch 820-k, and corresponds to the data sample signal $u_{kQ}(n)$. An earlier sample of the basis function output signal $f_k^\theta(x(n-1))$ corresponds to $u_{kQ+1}(n)$, and so on, up to the depth Q of the memory model. Thus, the last (oldest) sample in the memory model is $f_k^\theta(x(n-Q+1))$, corresponding to data sample $u_{(k+1)Q-1}(n)$.

Those skilled in the art will appreciate that the data samples $u_i(n)$ in FIG. 8 are indexed serially from the most recent basis function output signal in branch 0 to the oldest basis function output stored in the tapped delay line of branch 820-K-1, i.e., from $u_0(n)$ to $u_{KQ-1}$. These indexes represent the order of the elements in the vector u(n), as in Equation 5. Of course, other configurations and ordering of the data samples may be used instead.

The data samples $u_0(n)$ to $u_{KQ-1}(n)$ in FIG. 8B are each weighted by corresponding configurable tap weights $w_0^\theta$ to $w_{KQ-1}^\theta$, and summed to form the output signal d(n). The best weights to be used can be determined using the techniques described above, i.e., by taking N observations of the data samples $u_0(n)$ to $u_{KQ-1}(n)$, at N sampling instances, to form an N×KQ matrix U, and fitting the matrix U to a corresponding desired output vector d according to Equation 6 and a desired optimization criteria.

The input scaling factor $\beta^\theta$ is calculated based on the average signal power side information supplied by the system. In other words, the input signal is analyzed over a selected time interval, and a statistic characterizing the input signal over a selected time interval, in this case, average power, is calculated. The average power for x(n) is compared to the average power for the signal used to develop the non-configurable orthogonal basis function set 814 to determine the scaling factor $\beta^\theta$.

In one approach, the average power for the reference signal used to develop the orthogonal basis function set 814 is simply divided by the measured average power of the real-world signal x(n) to produce $\beta^\theta$. In another approach, a set of discrete scaling factors that correspond to ranges of measured input signal powers are pre-determined and stored in memory. Based on the measured average power, one of these pre-determined scaling factors is selected, and applied to the input scaling block 812.

Figure 9:
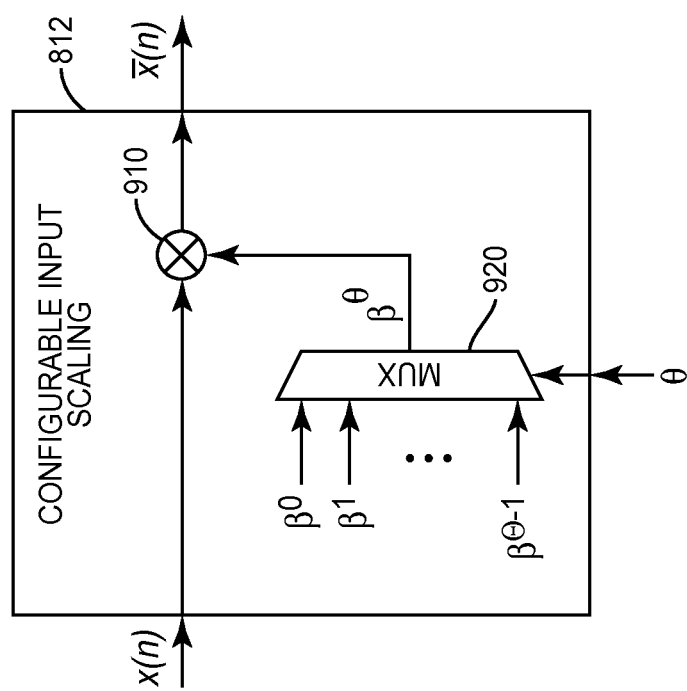
FIG. 9 illustrates details of one implementation of configurable input scaling.

FIG. 9 illustrates one way to implement this approach. Configurable input scaling block 812 comprises a multiplier 910 supplied by the output of demultiplexer 920. Demultiplexer 920 is indexed by a signal $\theta$ that corresponds to the measured statistic of the input signal x(n). $\theta$ may be, for example, a binary representation of the average power. $\theta$ is used by demultiplexer 920 to select one of a set of predetermined scaling factors $\beta^0$ to $\beta^{\Theta-1}$, where $\Theta$ is the number of factors in the set. The selected factor $\beta^\theta$ is applied to the input signal x(n) at multiplier 910, to produce the normalized input signal $\bar{x}(n)$.

Although the basis functions in the non-configurable orthogonal basis function set 814 are unchanged, each value of the input scaling factor $\beta^\theta$ effectively creates a distinct orthogonal basis function set. As a result, an individual set of tap coefficients w needs to be evaluated for the distortion model for each value of $\beta^\theta$. In practice, this can be done adaptively, by separately keeping track of data sample observations that correspond to each value for the input scaling factor, and separately deriving the weights that allow the distortion model to best fit the desired output.

For instance, suppose that there are three possible values for the scaling factor in a simple configuration, corresponding to low, medium, and high values of the input signal's average power. (In practice, the scaling factor may be permitted to take on more values, e.g., 16, 32, or 64.) When the input signal has a high average power, the input scaling factor is set to its corresponding value, and data samples (tap outputs) are collected for each of several sampling instances and saved. Likewise, when the input signal has a low, or medium power level, then data samples are collected, but are stored separately from the data samples collected for the high power level. Periodically, the N most recent observations from the set corresponding to the high input power level are used to calculate the optimal tap weights for the high input power level state. Those tap weights are saved for subsequent use. Likewise, optimal tap weights are calculated for each of the medium and low input power levels as well, and separately stored.

Figure 10:
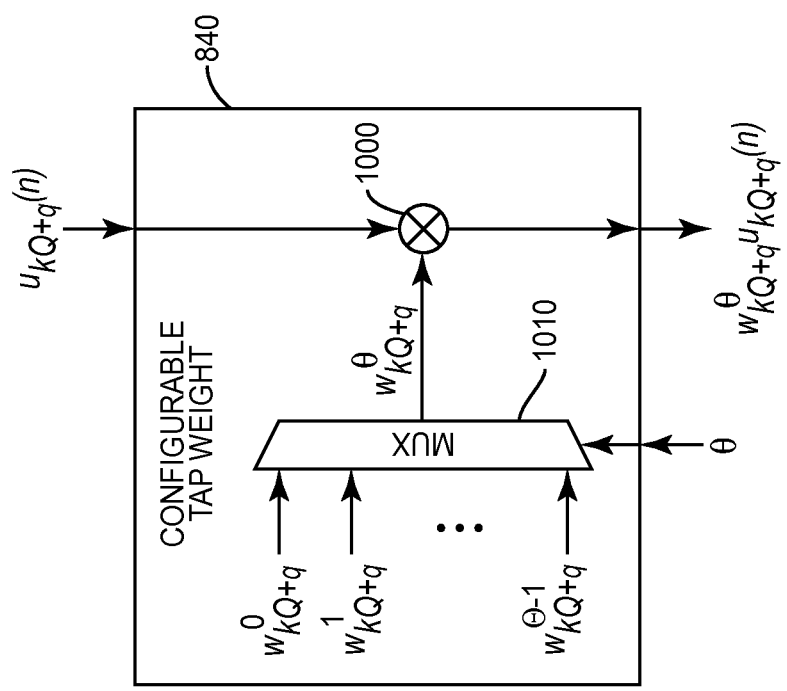
FIG. 10 illustrates an implementation of a configurable tap weight.

Subsequently, the saved weights for a given input level and corresponding input scaling factor can be retrieved and applied to the distortion model whenever that input scaling factor is in use. One approach to implementing this is shown in FIG. 10, which illustrates a configurable tap weight 840. Configurable tap weight 840 comprises a multiplier 1000 and a demultiplexer 1010. Demultiplexer 1010 selects from one of several stored tap weights ($w_{kQ+q}^0$ to $w_{kQ+q}^{\Theta-1}$ where $\Theta$ is the number of predetermined input scaling factors), using $\theta$, which corresponds to the statistic (e.g., power level) of the input signal. The selected tap weight $w_{kQ+q}^\theta$ is applied to the corresponding data sample $u_{kQ+q}(n)$ to generate the weighted data sample, which is summed with other weighted data samples to form the distortion model output d(n).

By using the appropriate scaling factor, as described above, the orthogonal basis function set that best matches the actual signal power is always selected. As a result, the condition number of the data matrix U is lowered compared to the case when the orthogonal basis function does not match the actual signal power. This approach is quite flexible, in the sense that when the signal power varies relatively slowly, the system can adjust the orthogonal basis functions applied accordingly, to therefore consistently achieve the best match.

For a system that has constantly varying signal powers, where it is not practical to adjust the orthogonal basis functions constantly, the system can be pre-configured to use a single orthogonal basis function set that satisfies certain criterion, for example, by minimizing the worst case condition number of the data matrix.

In practice, the techniques described are inexpensive to implement, as several of the advantages discussed above may be achieved by simply introducing an input scaling block in front of a conventional orthogonal basis function generator structure with configurable tap weights.

In the approaches described above, an input scaling block was combined with a fixed set of orthogonal basis functions to provide a configurable orthogonal basis function generator structure. Another approach to providing a configurable orthogonal basis function generator structure is to configure the distortion model so that any of several basis function sets may be used. In some embodiments, the particular basis function set used at any given time is selected based on a statistic of the input signal, such as the input signal's average power. The configurability of the orthogonal basis functions can be implemented, for example, by using a look-up table associated with each connection node in the basis function generator structure. Referring back to FIG. 6, for instance, the orthogonal basis functions $f_{ORTHO,0}(x(n))$ to $f_{ORTHO,K-1}(x(n))$ can be made configurable by providing for the configurability of each of the connection coefficients $c_{h,g}$ in the basis function set structure 600.

Figure 11:
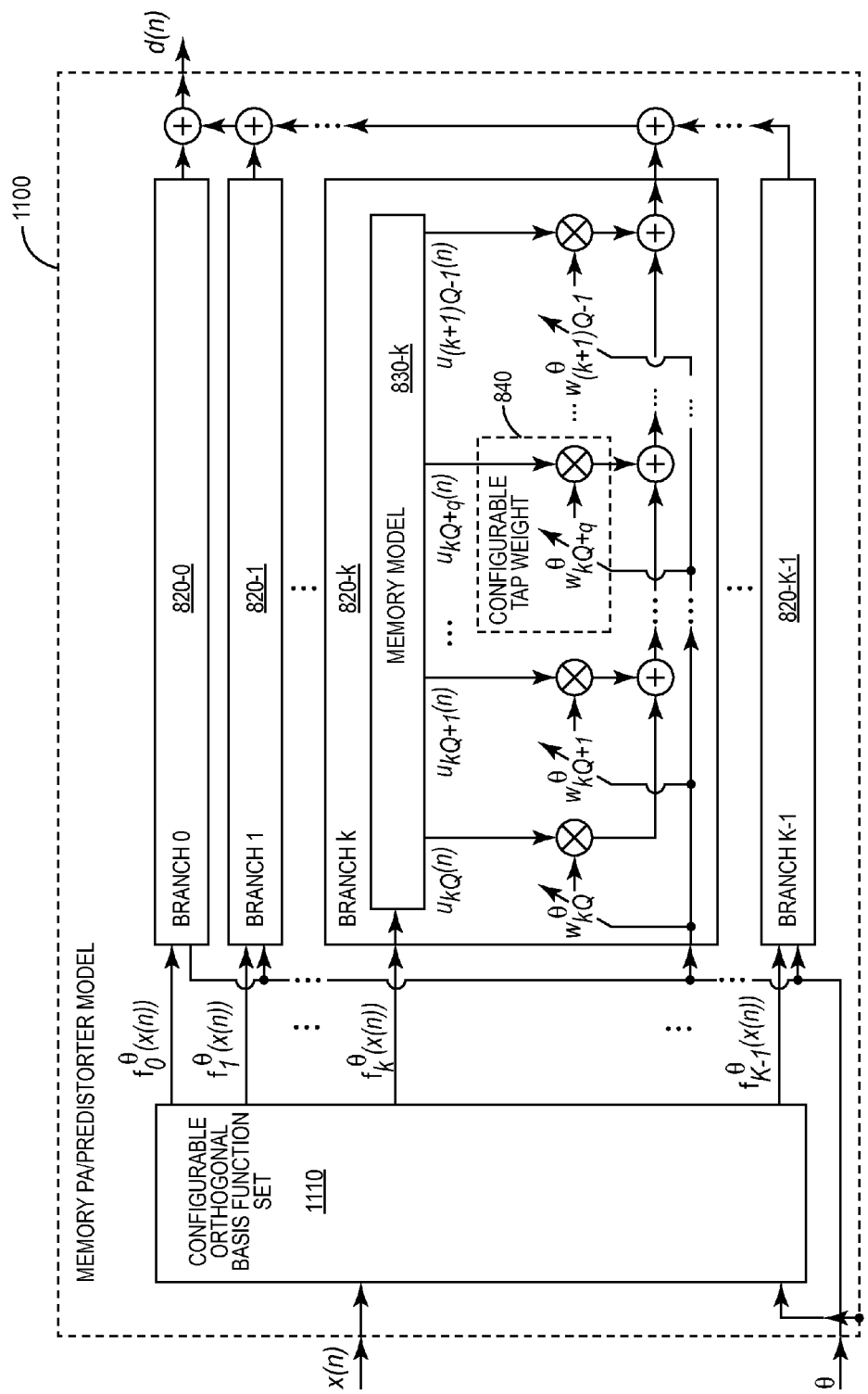
FIG. 11 illustrates another distortion model, including a configurable orthogonal basis function set according to some embodiments of the present invention.

One embodiment of this approach is shown in FIGS. 11 and 12. FIG. 11 provides a high-level illustration of distortion model 1100, which includes a configurable orthogonal basis function set 1110, providing basis function output signals $f_0^\theta(x(n))$ to $f_{K-1}^\theta(x(n))$ to corresponding branches 820-0 to 820-K-1. Each branch 820 includes a memory model 830 (which may be, for example, a tapped delay line memory model) and corresponding tap weights w. Thus, the branches 820 in FIG. 11 are similar to those illustrated in FIG. 8 and discussed in detail above.

Figure 12A:
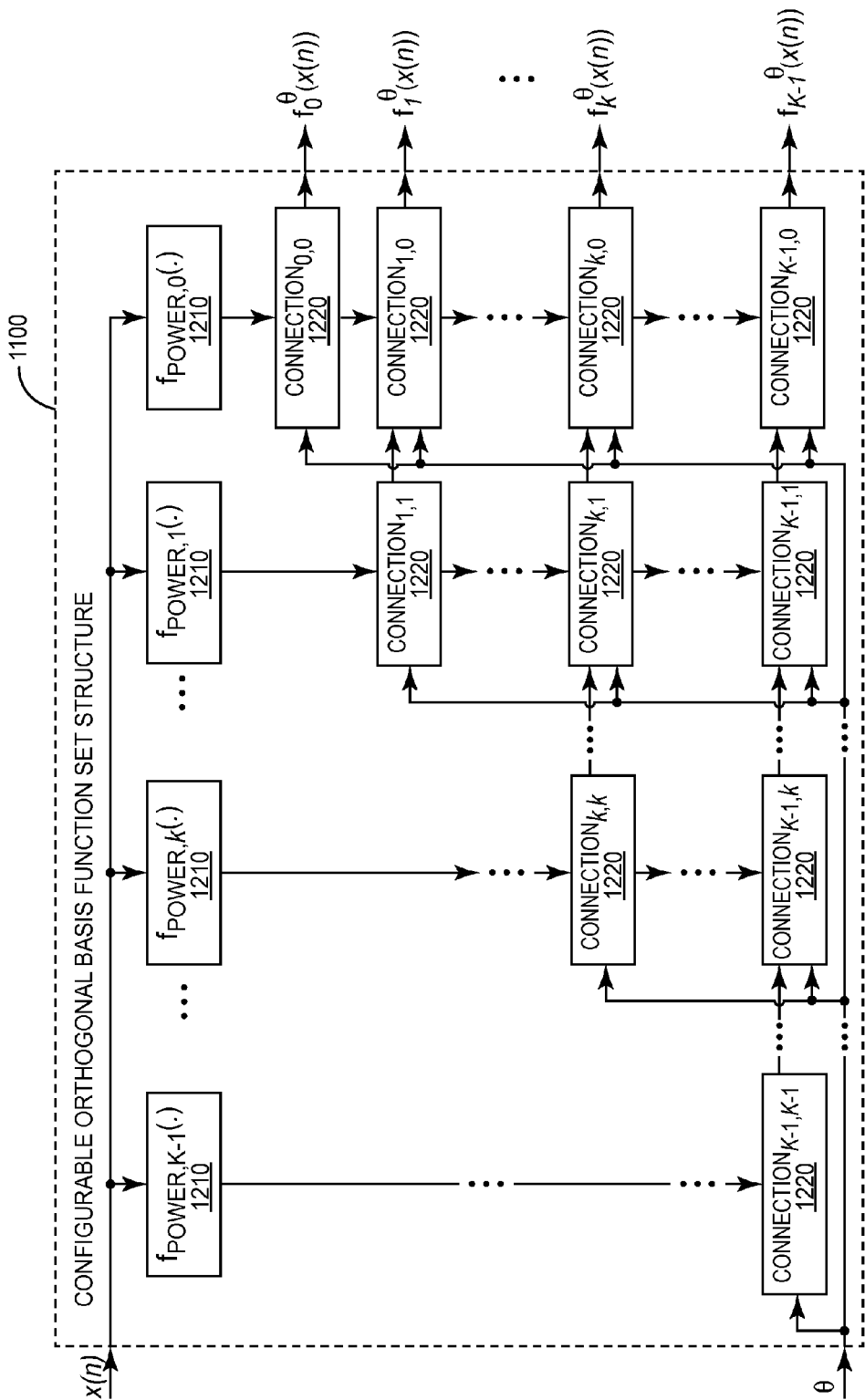
FIGS. 12A and 12B illustrate details of one implementation of a configurable orthogonal basis function structure.
Figure 12B:
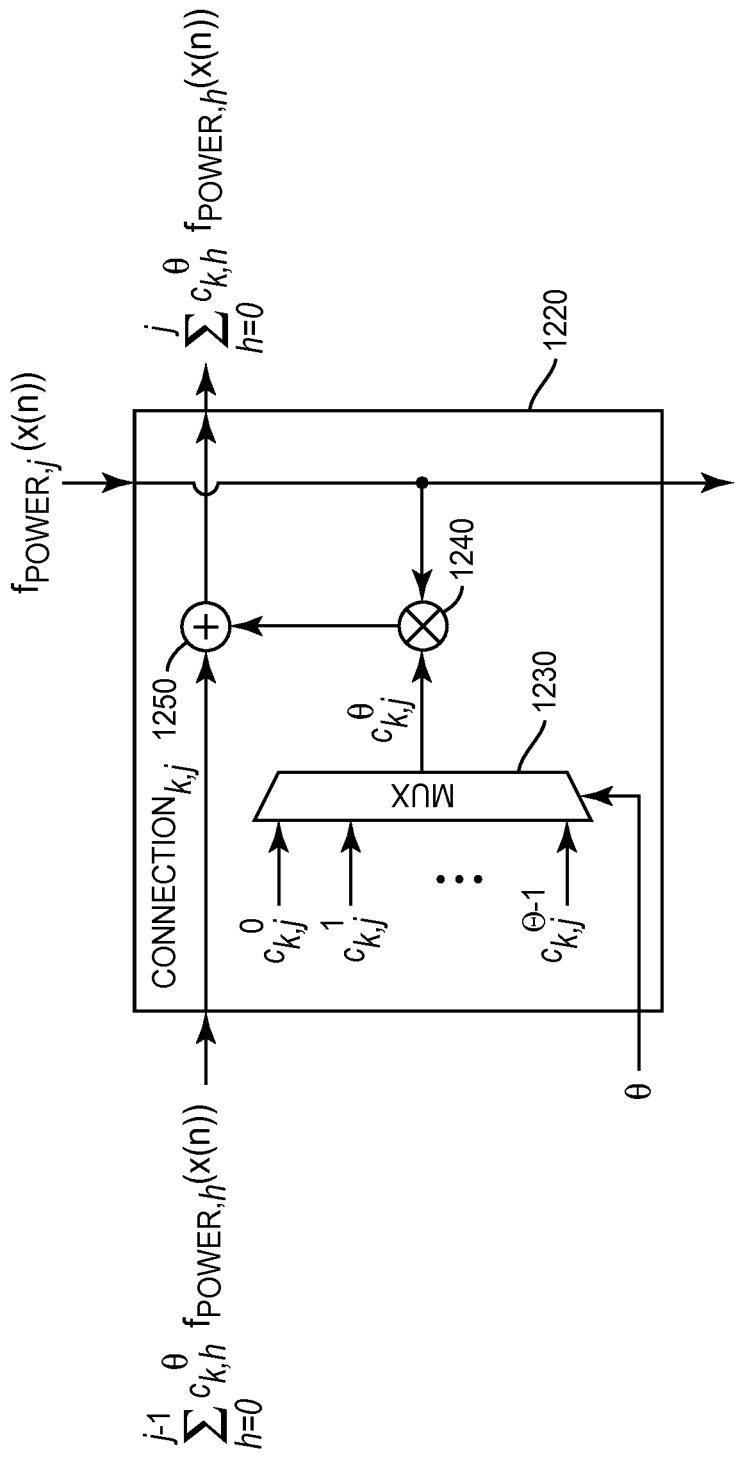

The configuration of configurable orthogonal basis function set 1110 is driven by parameter $\theta$, which corresponds to the measured statistic (e.g., average power) for the input signal x(n). FIGS. 12A and 12B provide additional details as to how this is done, in some embodiments. As seen in FIG. 12A, configurable orthogonal basis function set structure 1110 comprises an array of power functions 1210, which can be combined with one another, via connection blocks 1220, to form the orthogonal basis function output signals $f_0^\theta(x(n))$ to $f_{K-1}^\theta(x(n))$. As seen in FIG. 12B, each connection block 1220 comprises a demultiplexer 1230, which selects one of a predetermined set of values for connection coefficient $c_{k,j}$, based on the value of $\theta$. The selected connection coefficient $c_{k,j}$ is applied to one of the outputs of power functions 1210, via multiplier 1240, and combined with one or more other weighted power function outputs with summer 1250.

A system using this approach to a configurable orthogonal basis function set maintains several "ensembles" of connection coefficients $c_{k,j}$. Each ensemble corresponds to a particular value for the measured input signal statistic (e.g., the average power), and defines a particular orthogonal basis function set that provides good results (i.e., a data sample matrix with a low condition number) for that particular value of the input signal statistic. In some embodiments, the ensembles for each value of the input signal statistic are derived ahead of time, and stored in memory, for retrieval and application from a look-up table and/or through the demultiplexer circuit pictured in FIG. 12B.

As with the system illustrated in FIG. 8 and discussed above, each configuration of the configurable orthogonal basis function set 1110 should be used with a corresponding set of weighting coefficients w for the distortion model. Thus, the pre-distortion system maintains several sets of weighting coefficients, each set corresponding to one of the pre-determined orthogonal basis function sets available for use by the system. As was the case with the systems discussed above, each set of these weights can be derived adaptively, by collecting data samples and storing them according to the associated value for the parameter θ.

The number of orthogonal basis function sets that are actually used by the system may be chosen based on the operating scenarios, such as the expected range of characteristics for the input signal. (This range of characteristics may be driven by such things as loading, for example.) Each of these candidate basis function sets is optimized for a given signal characteristic (e.g., average power), and provides good results for real input signals that have similar characteristics. Thus, by selecting one of the predetermined sets of connection coefficients based on the characteristics of the input signal, the orthogonal basis function set that best matches the actual signal characteristics is always selected and the condition number of the data matrix generated from that basis function configuration is lowered compared to the case when the orthogonal basis function does not match the actual signal power.

As discussed earlier, when the signal characteristics vary slowly, the system could adjust the orthogonal basis functions applied accordingly, and therefore consistently achieve the best match. Likewise, for a system that has rapidly varying signal powers, where it is not practical to adjust the orthogonal basis functions constantly, the system may be configured to use a single orthogonal basis function set that satisfy certain criterion, for example minimizing the worst case condition number of the data matrix. In some systems, the number of orthogonal basis function sets that are available for selection may vary from one time to another, based on an evaluation of how quickly the signal statistics are changing.

FIG. 13 is a process flow diagram that illustrates a general method for compensating an input signal for distortion introduced by an electronic device operating on the input signal to produce an output signal. Those skilled in the art will appreciate that the process illustrated in FIG. 13 encompasses both of the techniques discussed above, and variants thereof.

The process of FIG. 13 begins, as shown at block 1310, with the calculation of a statistic characterizing the input signal to the distortion model. In many embodiments, this statistic is the average power of the input signal, although other statistics might be used. Strictly speaking, depending on whether an indirect-learning or direct-learning architecture is used, the "input signal" that is characterized by this statistic is the input to the distortion model, and may thus correspond either to the input of the electronic device (in the direct-learning architecture) or the output of the device (in the indirect-learning architecture). In some embodiments, however, it may be more practical to measure this statistic using digital baseband signals that correspond to the input of the electronic device, regardless of whether the indirect-learning or direct-learning architecture is used—this statistic is likely to reasonably characterize the input signal to the distortion model in either event. In some embodiments, the statistic may be determined a priori, e.g., based on empirical data for the input signal, rather than being dynamically calculated.

The process of FIG. 13 continues, as shown at block 1320, with the selection of a pre-determined basis function configuration, based on the measured statistic. As discussed in detail above, in some embodiments each of the predetermined basis function configurations comprises an input scaling factor that differs for each of the plurality of basis function configurations and a basis function set that is the same for all of the plurality of basis function configurations. In these embodiments, then, one of the predetermined basis function configurations is selected by simply selecting the input scaling factor, based on the statistic.

In other embodiments, each of the predetermined basis function configurations comprises a basis function set that differs for each of the plurality of basis function configurations. In these embodiments, selecting one of the basis function configurations means selecting one of the basis function sets, e.g., selecting a set of connection coefficients as described above, based on the statistic. In some of these embodiments, then, each basis function set comprises one or more polynomials comprising a sum of power functions weighted by connection coefficients, such that selecting one of the predetermined basis function configurations comprises selecting a set of connection coefficients, based on the statistic.

As shown at block 1330, the process continues with the determining of pre-distortion model weights for the selected configuration. In some cases, this may include retrieving, from memory, previously calculated pre-distortion model weights corresponding to the selected basis function configuration. In some of these embodiments, pre-distortion model weights corresponding to at least one of the pre-determined set of basis function configurations are dynamically adapted, such that the previously calculated pre-distortion model weights retrieved from memory are previously adapted pre-distortion model weights corresponding to the selected basis function configuration.

Finally, the selected basis function configuration and the corresponding pre-distortion model weights are applied to the signal, as shown at block 1340, to compensate for the distortion introduced by the electronic device. This application may be done by a signal processor configured to carry out mathematical operations corresponding to the distortion models discussed above, or by specialized hardware including multipliers, adders, and demultiplexers as pictured in FIGS. 3-12, or by some combination of both.

The process flow of FIG. 14 illustrates details of a process for determining the pre-distortion model weights in some embodiments of the general method illustrated in FIG. 13. The method pictured in FIG. 14 may be applied, for example, to the dynamic adaptation of pre-distortion model weights corresponding to one of the selectable basis function configurations. As shown at block 1410, the process begins with collecting first signal samples, corresponding to the input signal, over two or more time intervals during which the given basis function configuration is applied to the input signal. Second signal samples, corresponding to the output signal, are also collected, such that the second signal samples correspond in time to the first signal samples. As indicated at block 1420, the first and second signal samples are used to calculate adapted pre-distortion model weights, e.g., using the techniques described above for fitting a data sample U to a desired output signal vector. These adapted pre-distortion model weights are subsequently applied to the input signal to the predistorter, as shown at block 1430.

The process for calculating the adapted pre-distortion model weights varies, depending on whether an indirect-learning approach or a direct-learning approach is used. With the former approach, a set of pre-distortion model weights are estimated directly from the first and second signal samples, which correspond to the electronic device's input signal and output signal, respectively. The direct-learning approach is illustrated in FIG. 15. In this approach device distortion parameters for a distortion model of the electronic device are first calculated from the first and second signal samples, as shown at block 1510, where the device distortion model is based on the selected basis function configuration and reflects distortion introduced by the non-linear electronic device. Next, as shown at block 1520, pre-distortion model weights are calculated from the device distortion parameters.

Figure 16:
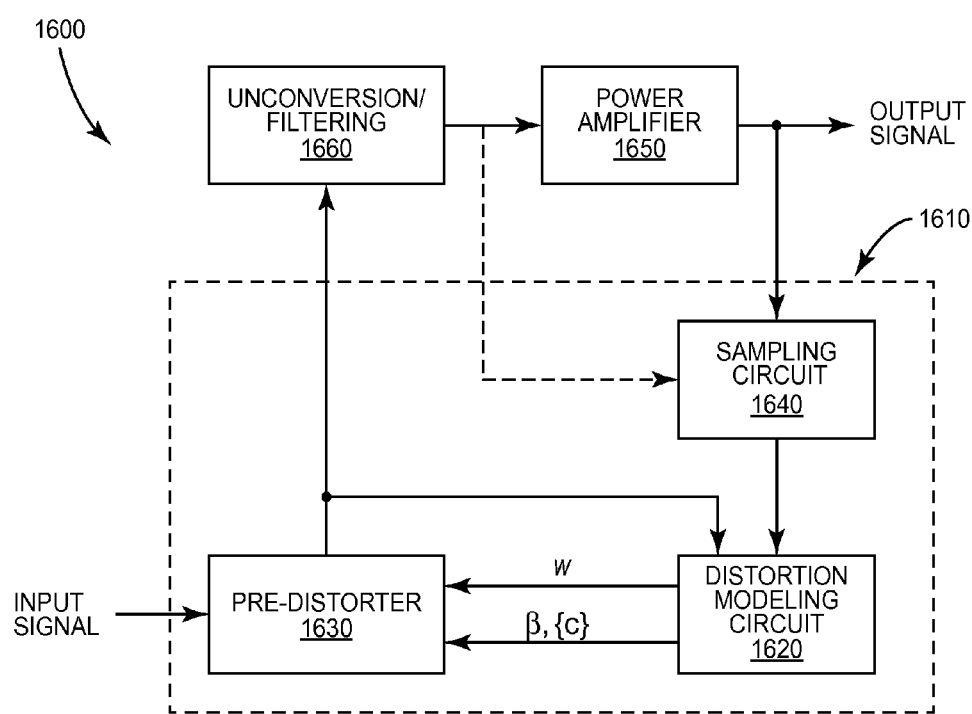
FIG. 16 is a schematic diagram of a distortion compensation circuit according to some embodiments of the present invention.

FIG. 16 is a block diagram illustrating a circuit 1600 configured to compensate an input signal for distortion introduced by an electronic device operating on the input signal to produce an output signal. More particularly, FIG. 16 illustrates a pre-distortion circuit 1610 that is configured to compensate for distortion introduced to a communications signal by power amplifier 1650. Thus, circuit 1600 may be used in a wireless transmitter circuit, for example, such as may be found in a cellular base station or a wireless mobile device.

Pre-distortion circuit 1610 includes a distortion modeling circuit 1620, a predistorter 1630, and a sampling circuit 1640. Sampling circuit 1640 (which may include a downconverter to shift the power amplifier output signal to baseband or to a lower frequency) takes samples of the output from power amplifier 1650 and provides them to the distortion modeling circuit 1620. In some embodiments, sampling circuit 1640 may also be configured to take samples of the input to power amplifier 1650. In others, however, distortion modeling circuit 1620 may instead use digital baseband samples corresponding to the input signal before it is upconverted (by upconversion/filtering circuit 1660) to radio frequencies.

Distortion modeling circuit 1620 comprises a processor circuit (consisting of, for example, one or more microprocessors, microcontrollers, digital signal processors, or the like) configured with appropriate software and/or firmware to carry out one or more of the techniques discussed above and illustrated in the process flows of FIGS. 13-15. Thus, distortion modeling circuit 1620 is configured to calculate a statistic (such as average signal power) characterizing the input signal over a selected time interval, from samples of the input signal, and to select, based on the statistic, one of a predetermined set of basis function configurations for a non-linear model of pre-distortion for compensating the distortion introduced by the electronic device. Distortion modeling circuit 1620 is further configured to determine an appropriate set of pre-distortion model weights corresponding to the selected basis function configuration, and to supply these weights (denoted w, in FIG. 16) to predistorter application circuit 1630.

Predistorter application circuit 1630 is configured to apply the selected basis function configuration and the corresponding set of pre-distortion model weights to the input signal, to produce a pre-distorted input signal for input to the electronic device (via upconversion/filtering circuit 1660). Pre-distortion application circuit 1630 replicates the same structure for a distortion model as was used in calculating the pre-distortion model weights. Thus, for example, predistorter circuit 1630 may operate according to one of the structures shown in FIG. 8 or 12. Those skilled in the art will appreciate that pre-distortion application circuit 1630 may be implemented using a microprocessor, in some embodiments, in which case the multiplication, addition, and demultiplexing operations illustrated in those figures are implemented with appropriate software. (In some of these embodiments, pre-distortion application circuit 1630 may share one or more processors with distortion modeling circuit 1620.) In other embodiments, pre-distortion modeling circuit 1630 may be implemented partly or entirely with hardware, i.e., using hardware multipliers, adders, and/or demultiplexers.

In some embodiments, the selectable basis function configurations each comprise an input scaling factor that differs for each of the plurality of basis function configurations and a basis function set that is the same for all of the plurality of basis function configurations. In these embodiments, the processor circuit in distortion modeling circuit 1620 is configured to select a basis function configurations by selecting the input scaling factor, based on the statistic. This input scaling factor (shown as $\beta$, in FIG. 16) is supplied to the pre-distortion application circuit 1630 for application to the input signal.

In other embodiments, each of the selectable basis function configurations comprises a basis function set that differs for each of the plurality of basis function configurations, and the processor circuit in distortion modeling circuit 1620 is configured to select one of the basis function configurations by selecting one of the basis function sets, based on the statistic. As discussed in detail earlier, each of these basis function sets may comprise one or more polynomials comprising a sum of power functions weighted by connection coefficients, such that the processor circuit is configured to select one of the basis function configurations by selecting a set of connection coefficients, based on the statistic. These connection coefficients, (shown as $\{c\}$ in FIG. 16), are passed by the distortion modeling circuit 1620 to pre-distortion application circuit 1630 for configuring the basis function set therein.

In any of the embodiments discussed above, the processor circuit in distortion modeling circuit 1620 may be further configured to determine the set of pre-distortion model weights (w) by retrieving previously calculated pre-distortion model weights corresponding to the selected basis function configuration. In some cases, the processor circuit is further configured to dynamically adapt pre-distortion model weights corresponding to at least one of the basis function configurations, wherein the previously calculated pre-distortion model weights comprise previously adapted pre-distortion model weights corresponding to the selected basis function configuration. In some of these embodiments, the processor circuit does this by collecting samples of the input signal over two or more time intervals during which the given basis function configuration is applied to the input signal, to obtain first signal samples, and collecting samples of the output signal that correspond in time to the first signal samples, to obtain second signal samples. The processor circuit then dynamically adapts pre-distortion model weights corresponding to a given basis function configuration by calculating adapted pre-distortion model weights from the first signal samples and the second signal samples. As discussed earlier, this may be done according to either the indirect-learning or direct-learning approach.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method for compensating an input signal for distortion introduced by an electronic device operating on the input signal to produce an output signal, characterized in that the method comprises:
   calculating a statistic characterizing the input signal over a selected time interval;
   selecting, based on the statistic, one of a predetermined plurality of basis function configurations for a non-linear model of pre-distortion for compensating the distortion introduced by the electronic device, wherein each basis function configuration corresponds to a different basis function set;
   determining a set of pre-distortion model weights corresponding to the selected basis function configuration;
   applying the selected basis function configuration and the set of pre-distortion model weights to the input signal, to produce a pre-distorted input signal for input to the electronic device.

2. The method of claim 1, wherein the statistic comprises an average signal power over the selected time interval.

3. The method of claim 1, wherein each of the predetermined plurality of basis function configurations comprises an input scaling factor that differs for each of the plurality of basis function configurations and a basis function set that is the same for all of the plurality of basis function configurations, and wherein selecting one of the predetermined plurality of basis function configurations comprises selecting the input scaling factor, based on the statistic.

4. The method of claim 1, wherein each of the predetermined plurality of basis function configurations comprises a basis function set that differs for each of the plurality of basis function configurations, and wherein selecting one of the predetermined plurality of basis function configurations comprises selecting one of the basis function sets, based on the statistic.

5. The method of claim 4, wherein each basis function set comprises one or more polynomials comprising a sum of power functions weighted by connection coefficients, and wherein selecting one of the predetermined plurality of basis function configurations comprises selecting a set of connection coefficients, based on the statistic.

6. The method of claim 1, wherein determining the set of pre-distortion model weights comprises retrieving, from memory, previously calculated pre-distortion model weights corresponding to the selected basis function configuration.

7. The method of claim 6, further comprising dynamically adapting pre-distortion model weights corresponding to at least one of the pre-determined plurality of basis function configurations, wherein the previously calculated pre-distortion model weights comprise previously adapted pre-distortion model weights corresponding to the selected basis function configuration.

8. The method of claim 7, wherein dynamically adapting pre-distortion model weights corresponding to a given basis function configuration comprises:
   collecting first signal samples, corresponding to the input signal, over two or more time intervals during which the given basis function configuration is applied to the input signal;
   collecting second signal samples, corresponding to the output signal, such that the second signal samples correspond in time to the first signal samples; and
   calculating adapted pre-distortion model weights from the first signal samples and the second signal samples.

9. The method of claim 1, wherein determining the set of pre-distortion model weights comprises calculating the set of pre-distortion model weights from first signal samples corresponding to the input signal and second signal samples corresponding to the output signal, based on the selected basis function configuration.

10. The method of claim 9, wherein calculating the set of pre-distortion model weights from the first signal samples and the second signal samples comprises directly estimating the pre-distortion model weights from the first signal samples and the second signal samples.

11. The method of claim 9, wherein calculating the set of pre-distortion model weights from the first signal samples and the second signal samples comprises:
   estimating device distortion parameters for a device distortion model from the first and second signal samples, wherein the device distortion model is based on the selected basis function configuration and reflects distortion introduced by the non-linear electronic device; and
   calculating the pre-distortion model weights from the device distortion parameters.

12. A circuit for compensating an input signal for distortion introduced by an electronic device operating on the input signal to produce an output signal, characterized in that the circuit comprises:
   a processor circuit configured to:
      calculate a statistic characterizing the input signal over a selected time interval, from samples of the input signal;
      select, based on the statistic, one of a predetermined plurality of basis function configurations for a non-linear model of pre-distortion for compensating the distortion introduced by the electronic device, wherein each basis function configuration corresponds to a different basis function set; and
      determine a set of pre-distortion model weights corresponding to the selected basis function configuration; and
   a pre-distortion application circuit configured to apply the selected basis function configuration and the set of pre-distortion model weights to the input signal, to produce a pre-distorted input signal for input to the electronic device.

13. The circuit of claim 12, wherein the statistic comprises an average signal power over the selected time interval.

14. The circuit of claim 12, wherein each of the predetermined plurality of basis function configurations comprises an input scaling factor that differs for each of the plurality of basis function configurations and a basis function set that is the same for all of the plurality of basis function configurations, and wherein the processor circuit is configured to select one of the predetermined plurality of basis function configurations by selecting the input scaling factor, based on the statistic.

15. The circuit of claim 12, wherein each of the predetermined plurality of basis function configurations comprises a basis function set that differs for each of the plurality of basis function configurations, and wherein the processor circuit is configured to select one of the predetermined plurality of basis function configurations by selecting one of the basis function sets, based on the statistic.

16. The circuit of claim 15, wherein each basis function set comprises one or more polynomials comprising a sum of power functions weighted by connection coefficients, and wherein the processor circuit is configured to select one of the predetermined plurality of basis function configurations by selecting a set of connection coefficients, based on the statistic.

17. The circuit of claim 12, wherein the processor circuit is configured to determine the set of pre-distortion model weights by retrieving previously calculated pre-distortion model weights corresponding to the selected basis function configuration.

18. The circuit of claim 17, wherein the processor circuit is further configured to dynamically adapt pre-distortion model weights corresponding to at least one of the pre-determined plurality of basis function configurations, wherein the previously calculated pre-distortion model weights comprise previously adapted pre-distortion model weights corresponding to the selected basis function configuration.

19. The circuit of claim 18, wherein the processor circuit is further configured to:
- collect samples of the input signal over two or more time intervals during which the given basis function configuration is applied to the input signal, to obtain first signal samples;
- collect samples of the output signal that correspond in time to the first signal samples, to obtain second signal samples; and
- dynamically adapt pre-distortion model weights corresponding to a given basis function configuration by calculating adapted pre-distortion model weights from the first signal samples and the second signal samples.

20. The circuit of claim 12, wherein the processor circuit is configured to determine the set of pre-distortion model weights by calculating the set of pre-distortion model weights from first signal samples corresponding to the input signal and second signal samples corresponding to the output signal, based on the selected basis function configuration.

21. The circuit of claim 20, wherein the processor circuit is configured to calculate the set of pre-distortion model weights from the first signal samples and the second signal samples by directly estimating the pre-distortion model weights from the first signal samples and the second signal samples.

22. The circuit of claim 20, wherein the processor circuit is configured to calculate the set of pre-distortion model weights from the first signal samples and the second signal samples by:
- estimating device distortion parameters for a device distortion model from the first and second signal samples, wherein the device distortion model is based on the selected basis function configuration and reflects distortion introduced by the non-linear electronic device; and
- calculating the pre-distortion model weights from the device distortion parameters.

23. A wireless transmitter apparatus comprising a power amplifier configured to amplify an input signal to produce an output signal, wherein the wireless transmitter apparatus is characterized by further comprising:
- a processor circuit configured to:
  - calculate a statistic characterizing the input signal over a selected time interval, from samples of the input signal;
  - select, based on the statistic, one of a predetermined plurality of basis function configurations for a non-linear model of pre-distortion for compensating distortion introduced by the power amplifier, wherein each basis function configuration corresponds to a different basis function set; and
  - determine a set of pre-distortion model weights corresponding to the selected basis function configuration; and
- a pre-distortion application circuit configured to apply the selected basis function configuration and the set of pre-distortion model weights to the input signal, to produce a pre-distorted input signal for input to the power amplifier.

* * * * *